United States Patent [19]
Lee et al.

[11] Patent Number: 5,373,167
[45] Date of Patent: Dec. 13, 1994

[54] OPTO-ELECTRONIC DEVICE

[75] Inventors: Ming-Kwei Lee; Ray-Hwa Horng; Lin-Hung Haung, all of Kao Hsiung, Taiwan, Prov. of China

[73] Assignee: National Science Counsel, Taipei, Taiwan, Prov. of China

[21] Appl. No.: 996,795

[22] Filed: Dec. 24, 1992

[51] Int. Cl.$^5$ .............. H01L 29/00; H01L 27/14; H01L 29/04; H01S 3/19
[52] U.S. Cl. .................. 257/22; 257/15; 257/18; 257/64; 257/461; 257/432; 257/451; 372/46; 372/48
[58] Field of Search .............. 257/431, 432, 451, 461, 257/631, 15, 18, 22, 64, 432; 372/46, 48

[56] References Cited

U.S. PATENT DOCUMENTS

| | | | |
|---|---|---|---|
| 4,511,408 | 4/1985 | Holonyak, Jr. | 257/97 |
| 5,153,889 | 10/1992 | Sugawara et al. | 372/45 |
| 5,305,341 | 4/1994 | Nishikawa et al. | 372/45 |

Primary Examiner—Sara W. Crane
Assistant Examiner—Valencia M. Wallace
Attorney, Agent, or Firm—Christie, Parker & Hale

[57] ABSTRACT

An opto-electronic device with the physical and chemical characteristics at the junction thereof being well matched is disclosed. The opto-etectronic device includes a wafer, a first layer grown on the wafer, and a second layer grown on the first layer, wherein one of the first and second layers is an ordered structure while the other is a disordered structure.

18 Claims, 5 Drawing Sheets

OPTO-ELECTRONIC DEVICE

BACKGROUND OF THE INVENTION

The present invention relates generally to an opto-electronic device, and more particularly to an opto-electronic device with a junction.

Although the characteristics of the opto-electronic device with a junction have been improved significantly due to the design of the heterojunction, it still has a bottleneck, i.e., if there is a slight mismatching of the physical or chemical characteristics at the junction, the resulting device will have defects, which will inevitably cause deterioration of the characteristics thereof. Such defects may be reduced or alleviated by strictly controlling the heterojunction material system and the selection of the growth conditions, but such control is not only costly, but also is not always satisfactory.

SUMMARY OF THE INVENTION

It is therefore an object of the present invention to provide an opto-electronic device having a good junction characteristic.

Another object of the present invention is to provide an opto-electronic device, the growth system and procedures which are simple, and need not consider the memory effect of the system.

The basic technical concept of the present invention utilizes the practical principle that there is a different energy gap between the ordered and disordered structures, the junction of which is treated as a hetero-equivalent junction. The experiment demonstrated that the semiconductor device manufactured in accordance with this principle is improved in its characteristics, such as an increased luminescence intensity as well as the increased linear region of the luminescence intensity current diagram. Furthermore, the growth system therefore is simple, and does not need to consider the memory effect of the system. Moreover, since the heterojunction is made of the same material, its physical and chemical characteristics are self-matching and excellent, and the problem of the constituent mutual diffusion will not occur at the junction.

Utilizing the $Ga_{0.5}In_{0.5}P$ as an example, the ordered/disordered structures described above mean that if the Ga and In atoms are arranged at random on the sublattice, it is called a disordered structure. On the contrary, if the Ga and In atoms are arranged on the (111) lattice plane in the order of Ga-P-In-P, it is called an ordered structure.

In accordance with the present invention, an opto-electronic device includes a wafer, an ordered (disordered) first layer grown on the wafer, and a disordered (ordered) second layer grown on the first layer. Providing an ordered (disordered) third layer grown on the second layer can produce a better effect. The so-called opto-electronic device may be a light emitting diode (LED), a laser diode, or a high speed device. Of course, the wafer as well as the second or third layer should be provided with ohmic contacts in practical applications.

The materials for the layers may be a metal and a compound capable of providing phosphorus. The so-called metal, if being an organic metal, may be organo-metallic gallium or indium. The compound capable of providing phosphorus may be a gas, such as $PH_3$. The p-type dopant may be a Group II metal, and the n-type dopant may be a compound having s Group IV or VI element. Furthermore, the wafer of the present invention may be constituted by the GaAs.

BRIEF DESCRIPTION OF THE DRAWINGS

The present invention can be better understood with reference to the following description and accompanying drawings, in which.

DETAILED DESCRIPTION OF THE PREFERRED EMBODIMENTS

Figure 1:
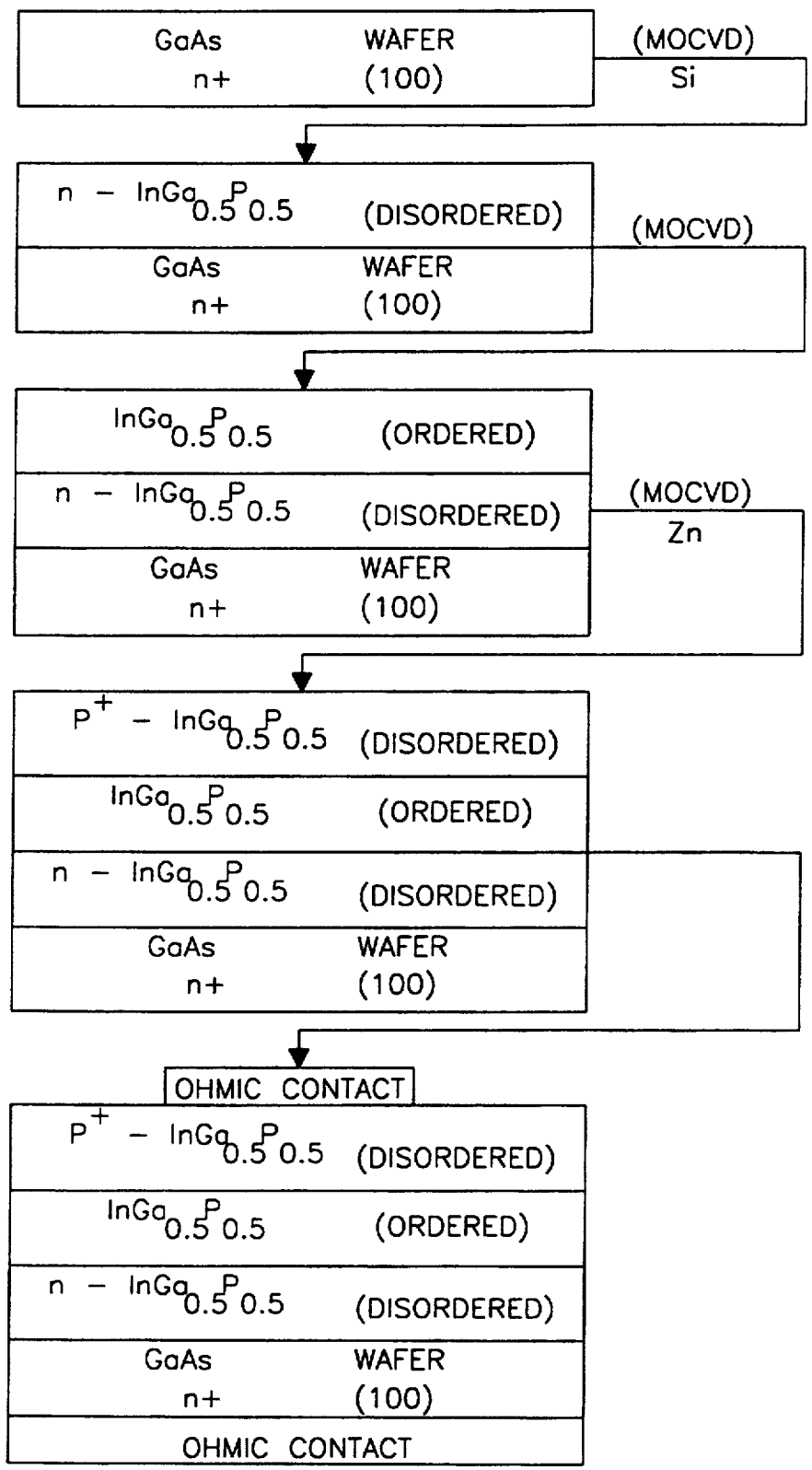
FIG. 1 shows the manufacturing process of an opto-electronic device in accordance with one preferred embodiment of the present invention.

According to a preferred embodiment of the present invention, an opto-electronic device includes a wafer, an ordered (disordered) first layer grown on the wafer, a disordered (ordered) second layer grown on the first layer, an ordered (disordered) third layer grown on the second layer, and two ohmic contacts provided on the wafer and the third layer respectively by means of a vacuum evaporation process. The manufacturing process for a red light emitting diode, which is grown on a GaAs wafer and has double heterojunctions, in accordance with the present invention, will be hereinafter described in detail, particularly with reference to FIG. 1.

First, a (100) 2° of [110] n+-GaAs substrate having a concentration of $7.3 \times 10^{18}$ cm$^{-3}$, an etch pit density (EPD) of $5 \times 10^3$ cm$^2$, and a thickness of 350 μm undergoes an epitaxy growth of the $Ga_{0.5}In_{0.5}P$ in a metal organic chemical vapor deposition (MOCVD) system. $(C_2H_5)_3Ga$ maintained at 5° C., $(CH_3)_3$ In retained at $-5°$ C. and $PH_3$ being 5% in $H_2$ are utilized as the growing materials for Ga, In, and P, respectively. In addition, $SiH_4$ being 500 ppm in $H_2$ and $(C_2H_5)_2Zn$ are utilized as the materials for the n-type dopant Si and p-type dopant Zn, respectively. The system is then heated by the high frequency wave, and the epitaxy is grown within a reaction tube having a diameter of 4.5 cm under a low pressure (100 Torr). The above-mentioned materials can all be bought from the Morton Company in the United States of America.

Figure 2:
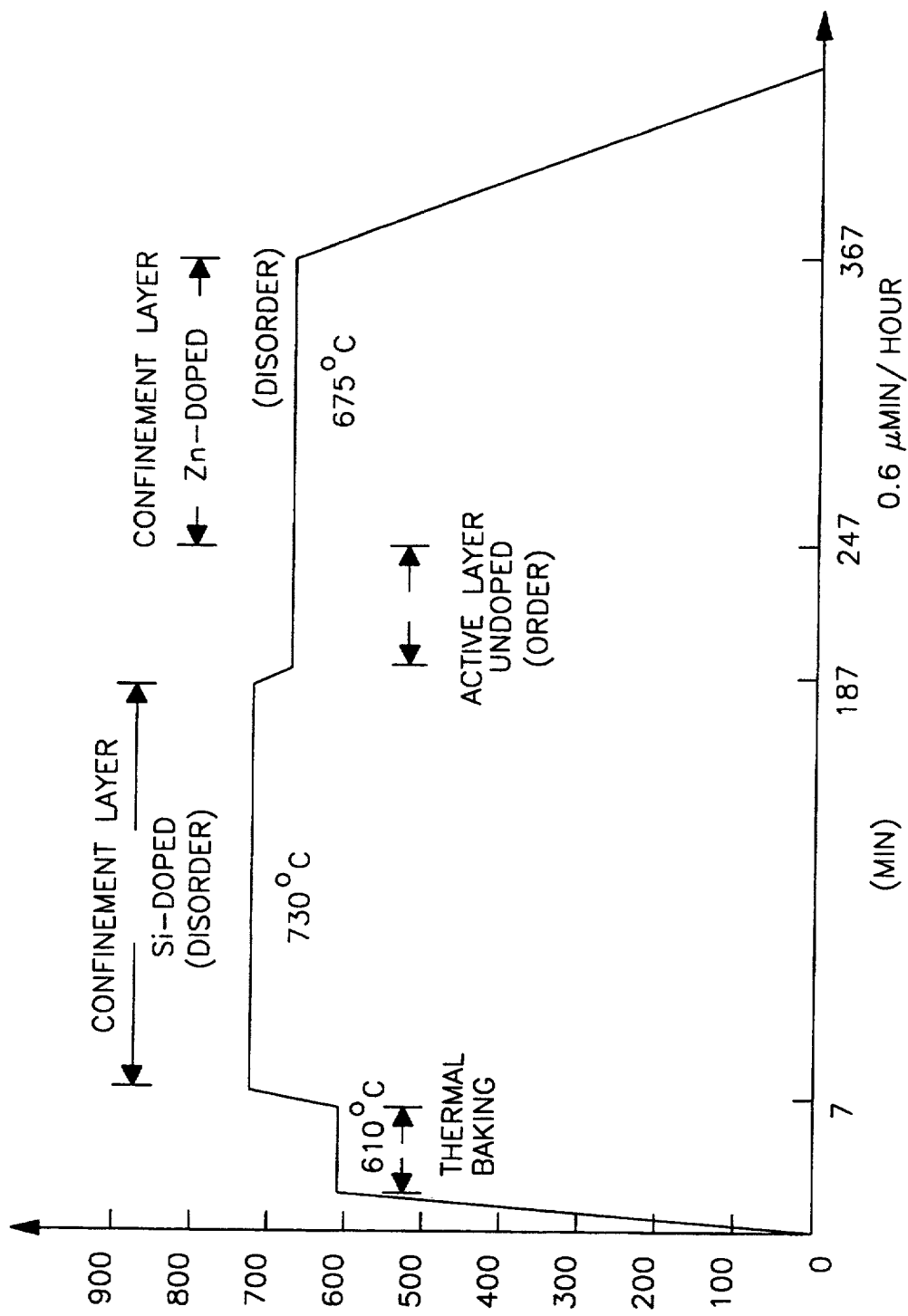
FIG. 2 is a growth temperature-growth time diagram in the manufacturing process for an opto-electronic device as shown in FIG. 1.

During growth, as shown in FIG. 2, a Si-doped n-type disordered $Ga_{0.5}In_{0.5}P$ layer is firstly grown as a lower confinement layer having a concentration of $3 \times 10^{17}$ cm$^{-3}$ at 730° C. An undoped and ordered active layer having a background concentration of $2 \times 10^{16}$ cm$^{-3}$ is then grown at 675° C. A high Zn-doped and disordered p-type upper confinement layer having a concentration of $3 \times 10^{18}$ cm$^{-3}$ is further grown at 675 ° C.

Figure 3:
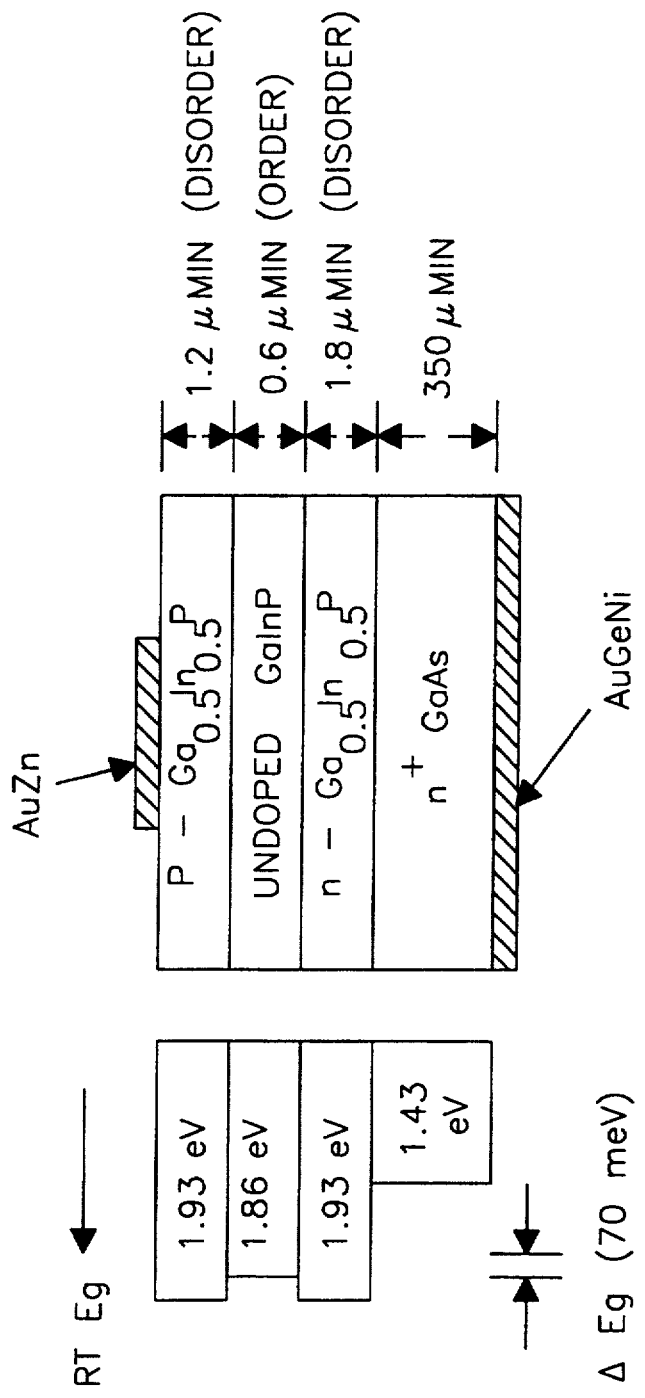
FIG. 3 is a diagram showing the relative energy gaps for an opto-electronic device as shown in FIG. 1.

Finally, after the ohmic contacts go through the vacuum evaporation process provided therewith, the light emitting diode with double heterojunction is completed. The relative energy gaps for such a diode are shown in FIG. 3.

Figure 4:
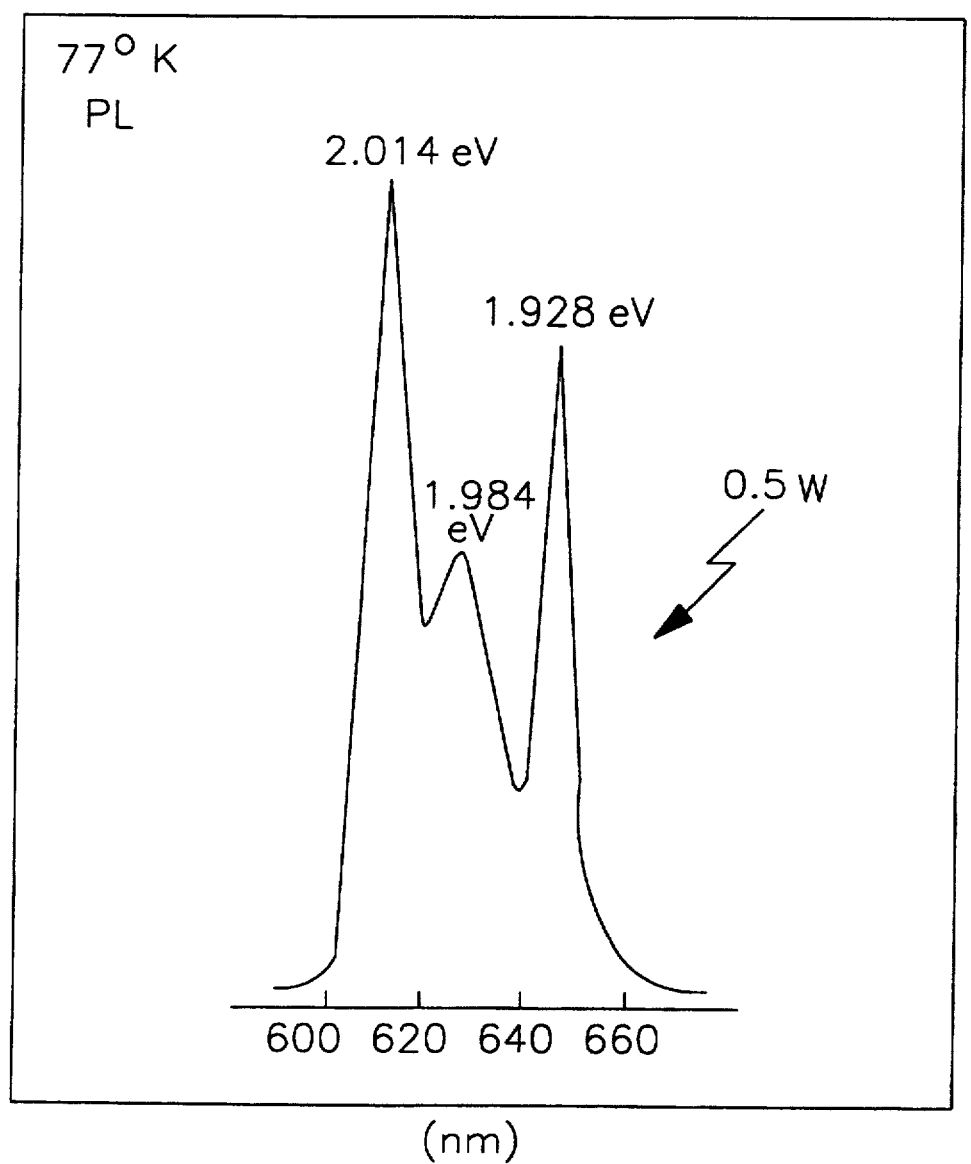
FIG. 4 is a diagram showing the testing results, by means of photoluminescence, of an opto-electronic device as shown in FIG. 1.

Since the ordered and disordered structures have different energy gaps and the photoluminescence is a good testing medium for the energy gaps. An experiment was conducted which shows the test results in FIG. 4, from which it can be clearly seen that the energy gap of the disordered structure is 2.014 eV while the energy gap of the ordered structure is 1.928 eV (with another Zn energy level at 1.984 eV). The energy gap difference of 86 meV is determined by the test conducted at 77° K. If the test is executed at room temperature (300° K.), the energy gap difference will be 70 meV.

Figure 5:
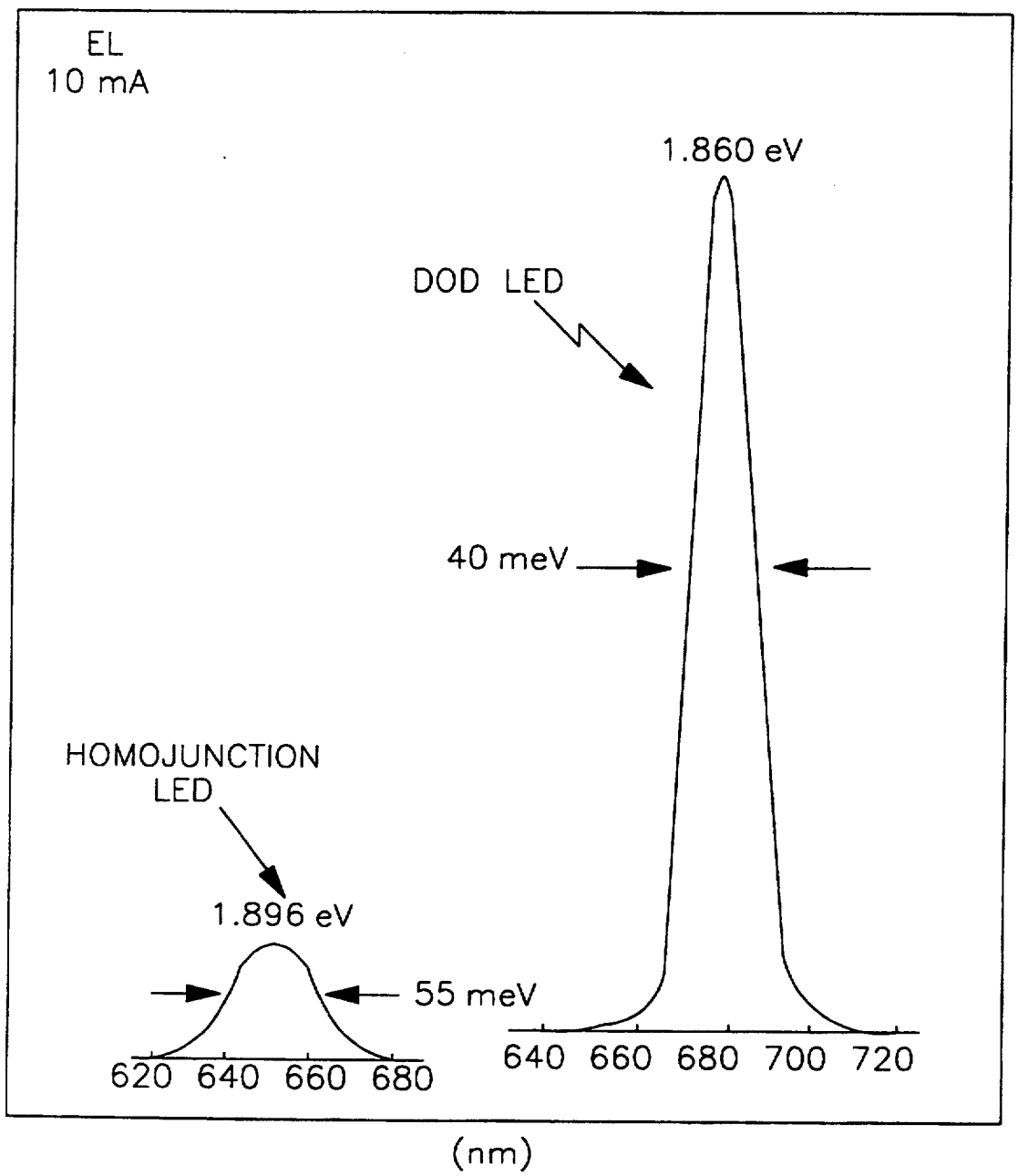
FIG. 5 is a comparative diagram of the luminescence intensity between an opto-electronic device of the present invention and the prior light emitting diode.

As shown in FIG. 5, the luminescence intensity of the present invention can be increased seven times if compared with the general $Ga_{0.5}In_{0.5}P$ light emitting diode with the homojunction.

In summary, the advantages of the present invention can be listed briefly as follows:

1. The characteristics of the resulting semiconductor device are significantly improved to successfully simulate that the device has a heterojunction;

2. The growth system for the present invention is simple, and does not need to consider the memory effect thereof;

3. The physical and chemical characteristics at the heterojunction can be self-matched, and the junction properties are excellent;

4. The problem of the constituent mutual diffusion will not occur at the junction;

5. The principle of the present invention can be applied to all of the disordered/ordered material systems; and 6. The growing process for the present invention is simple and easily controllable.

While the invention has been described in terms of what is presently considered to be the most practical and preferred embodiment, it is to be understood that the invention is not limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. An opto-electronic device comprising a wafer, a first layer grown on said wafer, and a second layer grown on said first layer, wherein said first and second layers are of the same composition of InGaD and one of said first and second layers is an ordered structure while the other is a disordered structure.

2. An opto-electronic device as claimed in claim 1 further comprising a third layer grown on said second layer and having a structure the same as that of said first layer.

3. An opto-electronic device as claimed in claim 1 wherein said opto-electronic device is a light emitting diode.

4. An opto-electronic device as claimed in claim 1 wherein said opto-electronic device is a laser diode.

5. An opto-electronic device as claimed in claim 1 wherein said opto-electronic device is a high speed device.

6. An opto-electronic device as claimed in claim 1 wherein said wafer and said second layer are provided with ohmic contacts respectively.

7. An opto-electronic device as claimed in claim 1 wherein materials provided for said first and second layers include a metal and a chemical compound capable of providing a chemical element of phosphorus.

8. An opto-electronic device as claimed in claim 7 wherein said materials further include an n-type dopant.

9. An opto-electronic device as claimed in claim 8 wherein said n-type dopant is a compound having a Group IV element.

10. An opto-electronic device as claimed in claim 8 wherein said n-type dopant is a compound having a Group VI element.

11. An opto-electronic device as claimed in claim 7 wherein said materials further include a p-type dopant.

12. An opto-electronic device as claimed in claim 11 wherein said p-type dopant is a Group II element.

13. An opto-electronic device as claimed in claim 7 wherein said metal is an organic metal.

14. An opto-electronic device as claimed in claim 13 wherein said organic metal includes organometallic gallium and indium.

15. An opto-electronic device as claimed in claim 7 wherein said compound is capable of providing phosphorus as a gas.

16. An opto-electronic device as claimed in claim 15 wherein said gas is $PH_3$.

17. An opto-electronic device as claimed in claim 1 wherein said wafer is formed of GaAs.

18. An opto-electronic device as claimed in claim 17 wherein said wafer is an n-type.

* * * * *